(12) United States Patent
Siemieniec et al.

(10) Patent No.: US 11,004,945 B2
(45) Date of Patent: May 11, 2021

(54) SEMICONDUCTOR DEVICE WITH SPICULAR-SHAPED FIELD PLATE STRUCTURES AND A CURRENT SPREAD REGION

(71) Applicant: Infineon Technologies Austria AG, Villach (AT)

(72) Inventors: Ralf Siemieniec, Villach (AT); Michael Hutzler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/418,616

(22) Filed: May 21, 2019

(65) Prior Publication Data

US 2020/0373396 A1 Nov. 26, 2020

(51) Int. Cl.
| | |
|---|---|
| H01L 29/40 | (2006.01) |
| H01L 29/06 | (2006.01) |
| H01L 29/10 | (2006.01) |
| H01L 29/417 | (2006.01) |
| H01L 29/78 | (2006.01) |

(52) U.S. Cl.
CPC ........ H01L 29/404 (2013.01); H01L 29/0619 (2013.01); H01L 29/1095 (2013.01); H01L 29/41725 (2013.01); H01L 29/7813 (2013.01)

(58) Field of Classification Search
None
See application file for complete search history.

(56) References Cited

U.S. PATENT DOCUMENTS

| | | | |
|---|---|---|---|
| 9,917,159 B2* | 3/2018 | Hutzler | ............... H01L 29/0615 |
| 2007/0108511 A1* | 5/2007 | Hirler | .................. H01L 29/407 |
| | | | 257/328 |
| 2015/0221765 A1 | 8/2015 | Zeng et al. | |
| 2016/0163804 A1* | 6/2016 | Kocon | ............... H01L 29/7832 |
| | | | 257/329 |
| 2017/0110573 A1 | 4/2017 | Laforet et al. | |

(Continued)

FOREIGN PATENT DOCUMENTS

| | | |
|---|---|---|
| DE | 102005052734 B4 | 2/2012 |
| DE | 102015104988 A1 | 10/2016 |
| DE | 102016103581 A1 | 8/2017 |

*Primary Examiner* — Long Pham
(74) *Attorney, Agent, or Firm* — Murphy, Bilak & Homiller, PLLC

(57) ABSTRACT

A semiconductor device includes: a semiconductor substrate having a drift region of a first conductivity type, a body region of a second conductivity type formed above the drift region, and a source region of the first conductivity type separated from the drift region by the body region; rows of spicular-shaped field plate structures formed in the semiconductor substrate, the spicular-shaped field plate structures extending through the source region and the body region into the drift region; stripe-shaped gate structures formed in the semiconductor substrate and separating adjacent rows of the spicular-shaped field plate structures; and a current spread region of the first conductivity type formed below the body region in semiconductor mesas between adjacent ones of the spicular-shaped field plate structures and which are devoid of the stripe-shaped gate structures. The current spread region is configured to increase channel current distribution in the semiconductor mesas.

12 Claims, 9 Drawing Sheets

(56) References Cited

U.S. PATENT DOCUMENTS

| | | |
|---|---|---|
| 2017/0236910 A1 | 8/2017 | Laforet et al. |
| 2017/0250256 A1 | 8/2017 | Siemieniec et al. |
| 2018/0122934 A1* | 5/2018 | Laforet ............. H01L 29/66734 |
| 2018/0350968 A1 | 12/2018 | Aichinger et al. |
| 2019/0006513 A1* | 1/2019 | Ouvrard ................ H01L 29/407 |
| 2019/0027472 A1 | 1/2019 | Naito |
| 2019/0027592 A1 | 1/2019 | Tanabe |
| 2019/0109227 A1 | 4/2019 | Kobayashi et al. |
| 2019/0109228 A1 | 4/2019 | Kobayashi et al. |
| 2020/0168719 A1* | 5/2020 | Liu ..................... H01L 29/1095 |

* cited by examiner

SEMICONDUCTOR DEVICE WITH SPICULAR-SHAPED FIELD PLATE STRUCTURES AND A CURRENT SPREAD REGION

BACKGROUND

Power MOSFETs (metal-oxide semiconductor field-effect transistor) typically have a field-plate for charge compensation, thereby offering a significant improvement in area-specific on resistance (RxA). Some power transistor cell designs use a stripe-trench for the field plates, with the gate electrode in the same stripe-shaped trench as the field electrode. Other power transistor cell designs place the field plate in a deep needle-shaped trench in the center of the cell and surround the needle-shaped trench with a separate trench which includes the gate electrode. The increased semiconductor mesa area between the deep needle-shaped trench in the center of the cell and the surrounding gate trench is expected to provide even lower overall on-resistance.

Different from stripe-shaped field plate designs, cell designs with a needle-shaped field plate trench at the center of the cell do not integrate the gate electrode in the field plate trench. Instead, the gate electrode is moved to a separate trench which surrounds the needle-shaped field plate trench in the center of the cell. To reduce the area-specific on-resistance, the gate trench must now form a grid across the chip (die) to use the additional semiconductor mesa area for current conduction.

As such, cell designs with a needle-shaped field plate trench at the center of the cell offer lower area-specific on-resistance and also reduce the output charge of the device which contributes significantly to overall losses in targeted applications. However, conventional cell designs with a needle-shaped field plate trench do not allow for an easy reduction of gate charge and gate-drain charge, as the overall gate area is significantly increased compared to a gate-stripe layout.

Thus, there is a need for a cell design with a needle-shaped field plate trench and lower gate charge and gate-drain charge with reduced impact on area-specific on-resistance.

SUMMARY

According to an embodiment of a semiconductor device, the semiconductor device comprises: a semiconductor substrate comprising a drift region of a first conductivity type, a body region of a second conductivity type formed above the drift region, and a source region of the first conductivity type separated from the drift region by the body region; rows of spicular-shaped field plate structures formed in the semiconductor substrate, the spicular-shaped field plate structures extending through the source region and the body region into the drift region; stripe-shaped gate structures formed in the semiconductor substrate and separating adjacent rows of the spicular-shaped field plate structures; and a current spread region of the first conductivity type formed below the body region in semiconductor mesas between adjacent ones of the spicular-shaped field plate structures and which are devoid of the stripe-shaped gate structures, the current spread region configured to increase channel current distribution in the semiconductor mesas.

The current spread region may abut a sidewall of the spicular-shaped field plate structures.

Separately or in combination, the current spread region may be confined by adjacent ones of the stripe-shaped gate structures.

Separately or in combination, the current spread region may laterally extend from a sidewall of each spicular-shaped field plate structure to a sidewall of the adjacent stripe-shaped gate structure.

Separately or in combination, the current spread region may comprise stripes which extend lengthwise between adjacent ones of the spicular-shaped field plate structures and intersect neighboring ones of the stripe-shaped gate structures.

Separately or in combination, the stripe-shaped gate structures may have lateral extensions which extend partly between adjacent ones of the spicular-shaped field plate structures so that a gap is present between each lateral extension and a neighboring one of the stripe-shaped gate structures, and the current spread region may be confined to the gaps between the lateral extensions of the stripe-shaped gate structures and the neighboring stripe-shaped gate structures.

Separately or in combination, the current spread region may comprise stripes which extend lengthwise between adjacent ones of the spicular-shaped field plate structures and terminate before reaching neighboring ones of the stripe-shaped gate structures.

Separately or in combination, the current spread region may be defined by contact grooves which run parallel with the stripe-shaped gate structures and are aligned with the rows of spicular-shaped field plate structures.

Separately or in combination, the spicular-shaped field plate structures may each comprise a field electrode disposed in a trench and a field dielectric insulating the field electrode from the semiconductor substrate.

Separately or in combination, the spicular-shaped field plate structures may each comprise a connection region connected to and which is narrower than the field electrode, the field electrode being located deeper in the trench than the connection region, and the current spread region may be formed adjacent the connection region of the spicular-shaped field plate structures.

Separately or in combination, the current spread region may have a peak doping concentration at a depth in the semiconductor substrate which is shallower than a bottom of the stripe-shaped gate structures.

According to an embodiment of a method of producing a semiconductor device, the method comprises: forming a drift region of a first conductivity type, a body region of a second conductivity type formed above the drift region, and a source region of the first conductivity type separated from the drift region by the body region in a semiconductor substrate; forming rows of spicular-shaped field plate structures in the semiconductor substrate, the spicular-shaped field plate structures extending through the source region and the body region into the drift region; forming stripe-shaped gate structures in the semiconductor substrate and separating adjacent rows of the spicular-shaped field plate structures; and forming a current spread region of the first conductivity type below the body region in semiconductor mesas between adjacent ones of the spicular-shaped field plate structures and which are devoid of the stripe-shaped gate structures, the current spread region configured to increase channel current distribution in the semiconductor mesas.

Forming the current spread region may comprise implanting a dopant species of the first conductivity type through the body region using a same lithography mask for forming the source region.

Separately or in combination, forming the current spread region may comprise: after forming the source region, forming a lithography mask on the semiconductor substrate and which has stripe-shaped openings which extend lengthwise between adjacent ones of the spicular-shaped field plate structures and intersect neighboring ones of the stripe-shaped gate structures; and implanting a dopant species of the first conductivity type through the body region using the lithography mask with the stripe-shaped openings.

Separately or in combination, the stripe-shaped gate structures may have lateral extensions which extend partly between adjacent ones of the spicular-shaped field plate structures so that a gap is present between each lateral extension and a neighboring one of the stripe-shaped gate structures, and forming the current spread region may comprise: after forming the source region, forming a lithography mask on the semiconductor substrate and which has openings over the gaps between the lateral extensions of the stripe-shaped gate structures and the neighboring stripe-shaped gate structures; and implanting a dopant species of the first conductivity type through the body region using the lithography mask with the openings over the gaps.

Separately or in combination, forming the current spread region may comprise: forming stripe-shaped grooves in the semiconductor substrate which extend lengthwise between adjacent ones of the spicular-shaped field plate structures and terminate before reaching neighboring ones of the stripe-shaped gate structures; and implanting a dopant species of the first conductivity type into the stripe-shaped grooves.

Separately or in combination, forming the current spread region may comprise: etching contact grooves into the semiconductor substrate which run parallel with the stripe-shaped gate structures and are aligned with the rows of spicular-shaped field plate structures, each contact groove having unetched stripe-shaped regions in parallel with one another; and implanting a dopant species of the first conductivity type into the contact grooves.

Separately or in combination, forming the rows of spicular-shaped field plate structures may comprise: etching rows of trenches in the semiconductor substrate; and forming a field electrode and a field dielectric insulating the field electrode from the semiconductor substrate in each trench.

Separately or in combination, the spicular-shaped field plate structures may each comprise a connection region connected to and which is narrower than the field electrode, the field electrode being located deeper in the trench than the connection region, and forming the current spread region may comprise forming the current spread region adjacent the connection region of the spicular-shaped field plate structures.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power transistor cell design with a needle-shaped field plate trench and lower gate charge and gate-drain charge with reduced impact on area-specific on-resistance. The power transistor device has rows of spicular-shaped field plate structures formed in the semiconductor substrate and stripe-shaped gate structures separating adjacent rows of the spicular-shaped field plate structures. A current spread region is formed in semiconductor mesas between adjacent ones of the spicular-shaped field plate structures and which are devoid of the stripe-shaped gate structures. The current spread region is configured to increase channel current distribution in the semiconductor mesas, thereby lowering gate charge and gate-drain charge with little to no adverse impact on area-specific on-resistance. The terms "needle-shaped" and "spicular-shaped" are used interchangeably herein to describe a trench structure formed in a semiconductor substrate and having a small or narrow circumference or width in proportion to its height/depth in the substrate, as opposed to a stripe-shaped trench structure which is longer than it is deeper.

Figure 1B:
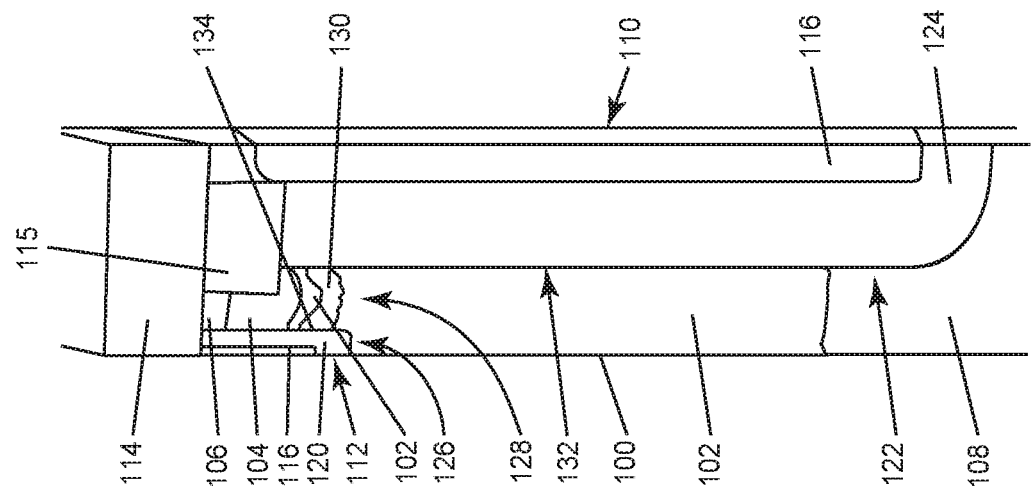
FIG. 1B illustrates a different partial cross-sectional view of the same power transistor cell.
Figure 1A:
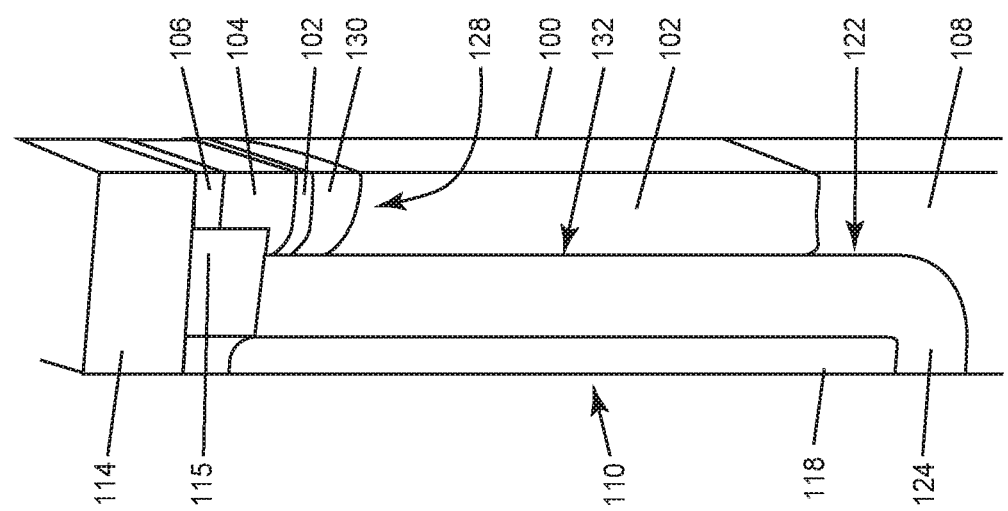
FIG. 1A illustrates a partial cross-sectional view of a power transistor cell with a current spread region.

FIG. 1A illustrates a partial cross-sectional view of a power transistor cell, and FIG. 1B illustrates a different partial cross-sectional view of the same power transistor cell. A semiconductor device may include dozens, 100s, 1000s or even more of the power transistor cells integrated on the same die and electrically coupled in parallel to form a power transistor. The semiconductor device may be a power MOSFET, an IGBT (insulated gate bipolar transistor), a HEMT (high-electron mobility transistor), etc. In each case, the semiconductor device includes a semiconductor substrate 100 comprising a drift region 102 of a first conductivity type, a body region 104 of a second conductivity type formed above the drift region 102, and a source region 106 of the first conductivity type separated from the drift region 102 by the body region 104. The drain region 108 of the semiconductor device may be disposed at the opposite side of the semiconductor substrate 100 as the source region 106. The term "source region" as used herein is intended to mean the source region of a power MOSFET or HEMT, or the emitter region of an IGBT. Similarly, term "drain region" as used herein is intended to mean the drain region of a power MOSFET or HEMT, or the collector region of an IGBT.

In the case of an n-channel device, the first conductivity type is n-type and the second conductivity type is p-type.

Conversely in the case of a p-channel device, the first conductivity type is p-type and the second conductivity type is n-type.

For either an n-channel or p-channel device, the semiconductor device includes rows of spicular-shaped field plate structures 110 formed in the semiconductor substrate 100. The semiconductor device also includes stripe-shaped gate structures 112 formed in the semiconductor substrate 100 and separating adjacent rows of the spicular-shaped field plate structures 110. An interlayer dielectric 114 such as an oxide, nitride etc. insulates electrical connections to the stripe-shaped gate structures 112 from electrical connections to the spicular-shaped field plate structures 110, and a highly doped contact region 115 may be provided for electrically contacting the body region 104. As mentioned above, only part of one transistor cell is shown in FIGS. 1A and 1B. However, FIGS. 5 through 9 show different embodiments of the semiconductor device and in which stripe-shaped gate structures 112 separate adjacent rows of spicular-shaped field plate structures 110.

The spicular-shaped field plate structures 110 extend through the source region 106 and the body region 104 into the drift region 102. The main current flow path of the device shown in FIGS. 1A and 1B is vertical, from the source region 106 to the drain region 108 and controlled by a voltage applied to a gate electrode 116 of the stripe-shaped gate structures 112. Field plates 118 of the spicular-shaped field plate structures 110 shape the electric field that builds up in the semiconductor substrate 100 when the device is in a blocking state, protecting the gate dielectric 120 and enhancing the breakdown characteristics of the device.

The spicular-shaped field plate structures 110 each include a field electrode 118 disposed in a trench 122 and a field dielectric 124 insulating the field electrode 118 from the semiconductor substrate 100. The stripe-shaped gate structures 112 each include a gate electrode 116 disposed in a trench 126 separate from the field plate trenches 122 and a gate dielectric 120 insulating the gate electrode 116 from the semiconductor substrate 100. The stripe-shaped gate structures 112 run along at least two sides of the needle-shaped field plate structures 110 (e.g. parallel but not orthogonal), or may even run along all four sides of the needle-shaped field plate structures 110 but not in continuous grids. That is, even if the stripe-shaped gate structures 112 run along all four sides of the needle-shaped field plate structures 100, there is a break or gap in some of the stripe-shaped gate structures 112 such that there are semiconductor mesas 128 located between adjacent ones of the spicular-shaped field plate structures 110 and which are devoid of the stripe-shaped gate structures 112.

Due to the use of spicular-shaped field plate structures 110 and stripe-shaped gate structures 112, the power transistor cell design has lower overall on-resistance. However, not all of the semiconductor material between adjacent spicular-shaped field plate structures 110 is influenced by the gate voltage, since the gate trenches 126 are formed as stripes and therefore do not completely surround individual ones of the spicular-shaped field plate structures 110 as explained above.

To reduce the area-specific on-resistance of the semiconductor device while also lowering the gate charge and gate-drain charge, the device also includes a current spread region 130 of the first conductivity type formed below the body region 104 in the semiconductor mesas 128 located between adjacent ones of the spicular-shaped field plate structures 110 and which are devoid of the stripe-shaped gate structures 112. The current spread region 130 has a higher average doping concentration than the drift region 102, and therefore increases the channel current distribution in the semiconductor mesas 128 which are devoid of the stripe-shaped gate structures 112.

The current spread region 130 distributes the channel current in the semiconductor mesas 128 into which the gate trenches 126 do not extend. By including the current spread region at least in the semiconductor mesas 128 located between adjacent ones of the spicular-shaped field plate structures 110 and which are devoid of the stripe-shaped gate structures 112, a less resistive region of the first conductivity type is provided just below the body region 104 in these mesa regions 128, allowing the channel current to spread out laterally in a more distributed manner as the channel current flows into the upper part of the drift region 102 and vertically toward the drain region 108.

Figure 2B:
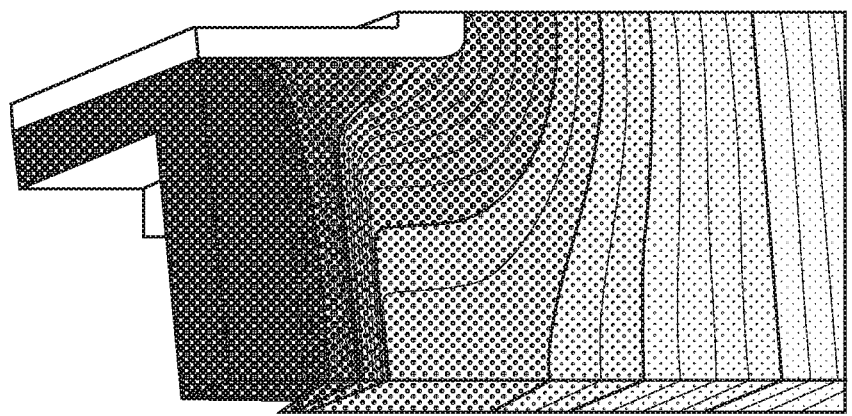
FIG. 2B shows the voltage drop for the cell shown in FIGS. 1A and 1B with the current spread region.
Figure 2A:
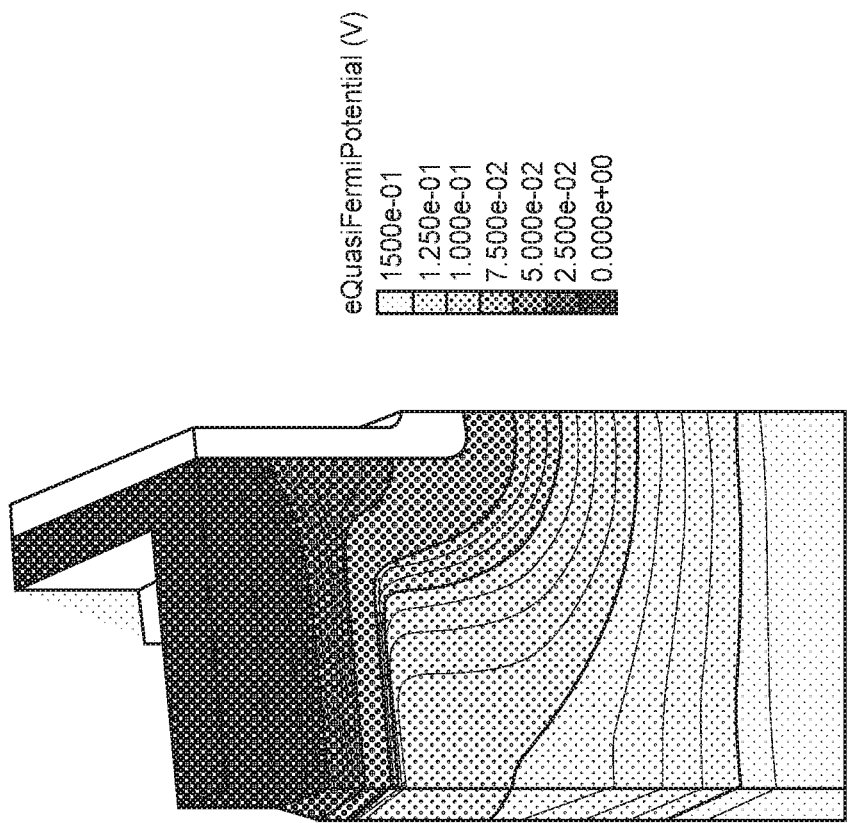
FIG. 2A shows the voltage drop for the cell shown in FIGS. 1A and 1B but without the current spread region.

FIG. 2A shows the voltage drop in electron quasi Fermi potential for the cell shown in FIGS. 1A and 1B but without the current spread region 130, and FIG. 2B shows the voltage drop for the cell shown in FIGS. 1A and 1B with the current spread region 130. FIG. 2B demonstrates that the semiconductor device with the current spread region 130 has better channel current spreading which yields a lower voltage drop for the device. For example, in some cases, the current spread region 130 may improve the area-specific on resistance (RxA) from 30 mill-Ohm $mm^2$ down to 27.3 mill-Ohm $mm^2$ or even lower while the breakdown voltage increases slightly. The amount of on-resistance improvement is based on the increase in doping of the current spread region 130. In one embodiment, the current spread region 130 has a graded doping profile that increases towards the body region 104 for lowering the on-resistance.

However, a practical limitation on the doping concentration of the current spread region 130 is set by a corresponding reduction in VFPmax. This requires a careful optimization due to the changed field distribution compared to a device with a continuous gate grid surrounding the field plate structures, resulting in higher breakdown voltage (BVDSS) and VFPmax for the same epitaxial layer stack.

VFPmax is not directly measurable at the device, but can be determined on a test structure where the field electrode 118 is separated from the source. With such a test structure, the potential of the field electrode 118 can be changed. By varying the potential of the field electrode 118, the blocking capability of the device changes. Therefore, the breakdown voltage may first rise with increasing the field electrode potential, reaching a maximum value which is defined as VFPmax. A further increase of the potential at the field electrode 118 results in a fast decline of the breakdown voltage, meaning the characteristic breakdown voltage over VFP is typically asymmetric. To provide a stable device behaviour that is robust against process tolerances, the device may be designed in a way that VFPmax is always positive.

If the field electrode potential is kept constant, e.g., typically at zero Volts as the field electrode 118 is connected to source potential, an increase of the doping yields the same behaviour—first a rising breakdown voltage and later a declining one. So VFPmax is a measure of how far away the device is from the theoretical maximum doping. VFPmax is also an indicator value for how much charge might be generated at the field-oxide interface in avalanche events. In such operation modes, some hot-carrier injection occurs at this interface and the generated charge does the same as an increased field electrode potential. To compare the performance including on-resistance of differently designed structures, not only the breakdown voltage but also VFPmax should be comparable.

Table 1 below demonstrates area-specific on-resistance (Ron X A) measured in milliohm per mm², VFPmax measured in Volts, breakdown voltage (BVDSS) measured in Volts, FOM (figure of merit) for gate charge (FOMg) which is the product of on-resistance and gate charge and measured in milliohm-nC, and FOM for gate-drain charge (FOMgd) which is the product of on-resistance and gate-drain charge and also measured in milliohm-nC, for different cell designs including the cell design illustrated in FIGS. 1A and 1B.

TABLE 1

|  | Ron X A (milliohm mm²) | BVDSS (V) | VFPmax (V) | FOMg (milliohm-nC) | FOMgd (milliohm-nC) |
| --- | --- | --- | --- | --- | --- |
| Cell Design 1 | 25 | 106.3 | 3 | 141.9 | 23.6 |
| Cell Design 2 | 30 | 106.6 | 4.9 | 96.0 | 16.5 |
| Cell Design 3 | 28.3 | 106.9 | 2.6 | 92.5 | 17.5 |
| Cell Design 4 | 27.3 | 106.9 | 0.4 | 90.2 | 17.9 |
| Cell Design 5 | 26.5 | 104.1 | −2.2 | 90.0 | 19.3 |
| Cell Design 6 | 25.9 | 97.4 | −5.8 | 88.5 | 20.7 |

The cell designs each have a spicular-shaped field plate structure at the center of the cell and the same epitaxial layer stack. However, 'Cell Design 1' has a gate trench which surrounds the needle-shaped field trench in a closed (continuous) grid-like manner. 'Cell Design 2' is the cell shown in FIGS. 1A and 1B, but without the current spread region 130. 'Cell Design 3' is the cell shown in FIGS. 1A and 1B with the current spread region 130 formed by an implantation dose of $5e11 cm^{-2}$. 'Cell Design 4' is the cell shown in FIGS. 1A and 1B with the current spread region 130 formed by an implantation dose of $1e12 cm^{-2}$. 'Cell Design 5' is the cell shown in FIGS. 1A and 1B with the current spread region 130 formed by an implantation dose of $1.5e12 cm^{-2}$. 'Cell Design 6' is the cell shown in FIGS. 1A and 1B with the current spread region 130 formed by an implantation dose of $2e12 cm^{-2}$.

Setting the implantation dose for the current spread region 130 too high yields negative VFPmax and decreases BVDSS, where higher implantation dose translates to increased doping. The doping concentration of the current spread region 130 depends on the device construction and targeted voltage class. Hence, the current spread region 130 may have different base doping levels for different cell constructions and voltage classes.

The doping level of the current spread region 130 effects the on-state resistance (Ron) of the device. The on-state resistance Ron corresponds to a defined amount of dopants per area and stretches to a certain depth, so the change in doping in the current spread region 130 can be identified as compared to the base doping of the drift region 102 even though both regions 102, 130 have the same conductivity type.

The current spread region 130 is formed under the body region 104 of the device, but preferably not too far under the gate trenches 126. If the current spread region 130 extends too far under the gate trenches 126, the electric field will increase at the bottom of the gate trenches 126 which can lead to gate dielectric degradation and eventually breakdown. The gate dielectric 120 may be thicker at the bottom of the gate trenches 126 to mitigate this risk. Ideally, the current spread region 130 does not extend at all under the gate trenches 130. However, this may not be practical.

Hence, the current spread region 130 may have some lateral extension under the gate trenches 126 which may be difficult to avoid. In the case of a thick bottom oxide, a deeper gate trench 126 may be used so that the gate electrode 116 is long enough to fully open the device channel.

The current spread region 130 has a higher average doping concentration than the drift region 102 as explained above. The current spread region 130 therefore has lower resistance that the drift region 102, allowing the channel current to spread (distribute) faster in multiple dimensions. The maximum doping concentration of the current spread region 130 ideally is at the junction with the body region 104, but this may not be practical. In one embodiment, the peak doping concentration of the current spread region 130 is at a depth in the semiconductor substrate 100 which is shallower than the bottom of the stripe-shaped gate structures 112. The peak doping concentration of the current spread region 130 may be 1.5× to 5× higher than the average doping concentration, e.g., 2× to 4× higher.

By providing the current spread region 130 below the body region 104 in the semiconductor mesas 128 located between adjacent ones of the spicular-shaped field plate structures 110 and which are devoid of the stripe-shaped gate structures 112, the spicular-shaped field plate structures 110 may be arranged in a grid whereas the gate structures 112 may be formed as stripes which run along two sides of each needle-shaped field plate 110 (e.g. parallel but not orthogonal) or even all 4 sides but without forming a closed (continuous) grid. The current spread region 130 increases the channel current distribution in the semiconductor mesas 128 between adjacent ones of the spicular-shaped field plate structures 110 and which are devoid of the stripe-shaped gate structures 112 and thereby lower gate charge and gate-drain charge, with little to no adverse impact on area-specific on-resistance.

Described next are various embodiments for the position, shape and formation of the current spread region 130 within each cell of a power semiconductor device. The current spread region 130 may abut a sidewall 132 of the spicular-shaped field plate structures 110, e.g., as shown in FIGS. 1A and 1B. The current spread region 130 may laterally extend from a sidewall 132 of each spicular-shaped field plate structure 110 to a sidewall 134 of the adjacent stripe-shaped gate structure 112, also as shown in FIGS. 1A and 1B.

Figure 3:
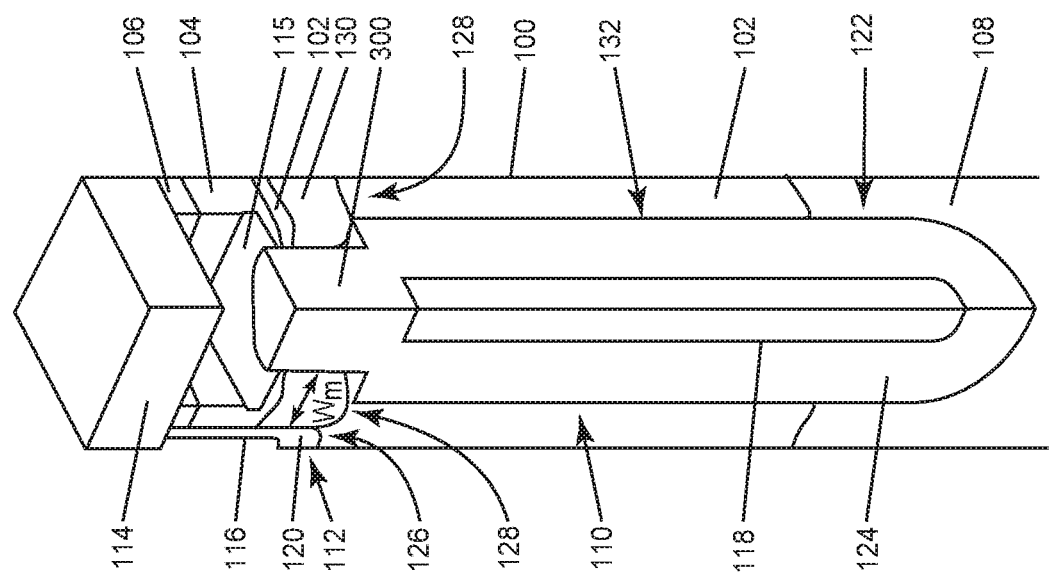
FIG. 3 illustrates a partial cross-sectional view of another power transistor cell with a current spread region.

FIG. 3 illustrates a partial cross-sectional view of a power transistor cell according to another embodiment. The power transistor cell embodiment shown in FIG. 3 is similar to the embodiment shown in FIGS. 1A and 1B. Different, however, the spicular-shaped field plate structures 110 each have a connection region 300 connected to and which is narrower than the field electrode 118. The connection region 300 is provided in the upper part of the field plate trenches 122, and provides a point of electrical connection to the field electrode 118 which is located lower in the field plate trenches 122 than the connection region 300. According to this embodiment, the current spread region 130 is formed adjacent the connection region 300 of the spicular-shaped field plate structures 100. Also, a smaller semiconductor mesa width ($W_m$) is realized by using the connection region 300 to contact the wider buried field plates 118. Hence, the mesa doping may be higher while the width into which the channel current spreads is lower.

Table 2 below demonstrates area-specific on-resistance (Ron X A), VFPmax, breakdown voltage (BVDSS), FOM (figure of merit) for gate charge (FOMg), and FOM for gate-drain charge (FOMgd), for different cell designs including the cell design illustrated in FIG. 3.

TABLE 2

| | Ron X A (milliohm mm²) | BVDSS (V) | VFPmax (V) | FOMg (milliohm-nC) | FOMgd (milliohm-nC) |
|---|---|---|---|---|---|
| Cell Design 1 | 20 | 100.2 | 5 | 117.2 | 20.8 |
| Cell Design 2 | 22.6 | 100.5 | 5 | 82.5 | 15.3 |
| Cell Design 3 | 21.8 | 100.5 | 3.3 | 82.2 | 16.8 |
| Cell Design 4 | 21.3 | 100.4 | 1.3 | 80.4 | 17.3 |
| Cell Design 5 | 21 | 98.6 | −1.4 | 80.2 | 18.4 |
| Cell Design 6 | 20.6 | 93.7 | −4.2 | 80.3 | 20.1 |

The cell design simulation parameters summarized in Table 2 are identical to those summarized in Table 1, except the 'Cell Design 3' through 'Cell Design 6' correspond to the cell embodiment shown in FIG. 3 instead of the cell embodiment of FIGS. 1A and 1B. Comparing the simulation results in Tables 1 and 2 for 'Cell Design 3' through 'Cell Design 6' shows that the cell embodiment illustrated in FIG. 3 allows for a more efficient lateral spreading of the channel current which results in less negative impact on the on-resistance as compared to the cell embodiment illustrated in FIGS. 1A and 1B.

Figure 4B:
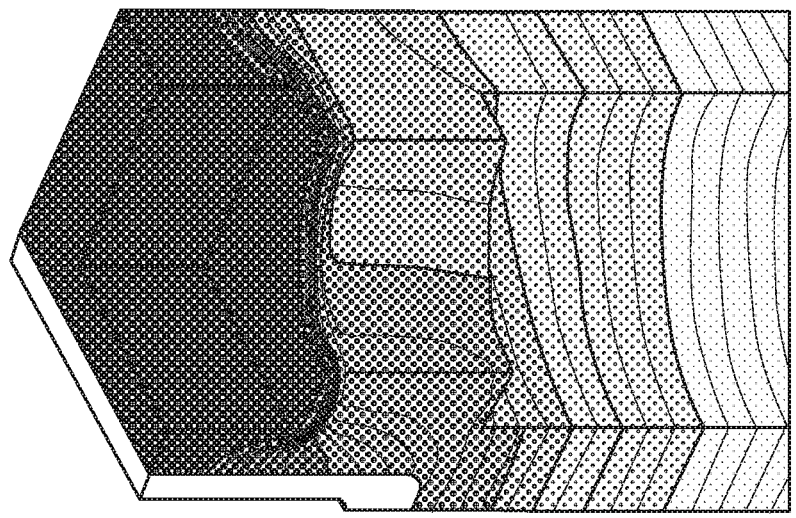
FIG. 4B shows the voltage drop for the cell shown in FIG. 3 with the current spread region.
Figure 4A:
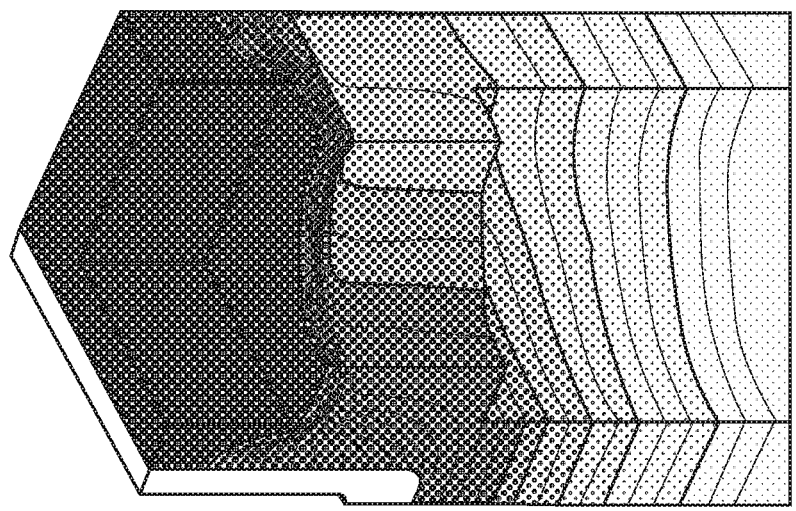
FIG. 4A shows the voltage drop for the cell shown in FIG. 3 but without the current spread region.

FIG. 4A shows the voltage drop in electron quasi Fermi potential for the cell shown in FIG. 3 but without the current spread region 130, and FIG. 4B shows the voltage drop for the cell shown in FIG. 3 with the current spread region 130. Like FIG. 2B, FIG. 4B demonstrates that the semiconductor device with the current spread region 130 has better channel current spreading which yields a lower voltage drop for the device. The amount of on-resistance improvement corresponds to the level of doping of the current spread region 130, as previously explained herein.

FIGS. 5 through 9 illustrate respective plan views of additional embodiments of the current spread region 130. The body and source regions 104, 106 are obscured/out of view in FIGS. 5 through 9 to provide an unobstructed view of the current spread region 130 in each case. The semiconductor devices shown in FIGS. 5 through 9 may have the same or similar epitaxial layer stack construction as shown in FIGS. 1A-1B and FIG. 3.

Figure 5:
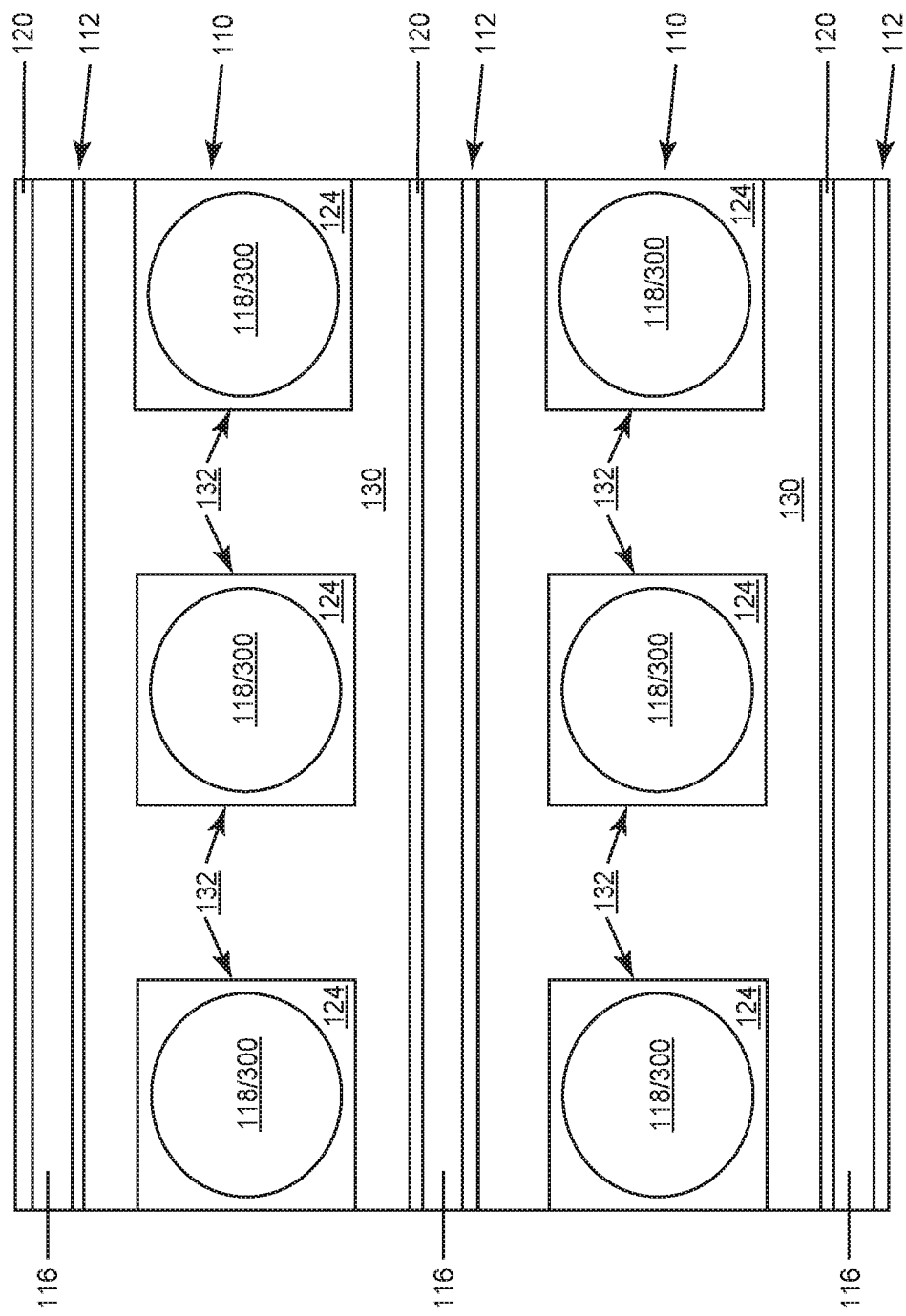
FIGS. 5 through 9 illustrate respective plan views of additional embodiments of the current spread region.

In FIG. 5, the current spread region 130 abuts the sidewall 132 of each spicular-shaped field plate structure 110 and is confined by adjacent ones of the stripe-shaped gate structures 112. The current spread region 130 may be formed by implanting a dopant species of the first conductivity type through the body region 104 using the same lithography mask for forming the source region 106. Hence, no additional lithography process is needed and no degradation of the edge termination blocking capability of the device occurs. That is, the existing source lithography is used and only an additional implant step is needed over the whole area to form the current spread region 130. However, a relatively high energy implant is needed to form the current spread region 130 underneath the body region 104, which may result in a large variation of the implanted ion depth. The implanted dopant species is activated, e.g., by annealing to form the current spread region 130.

Figure 6:
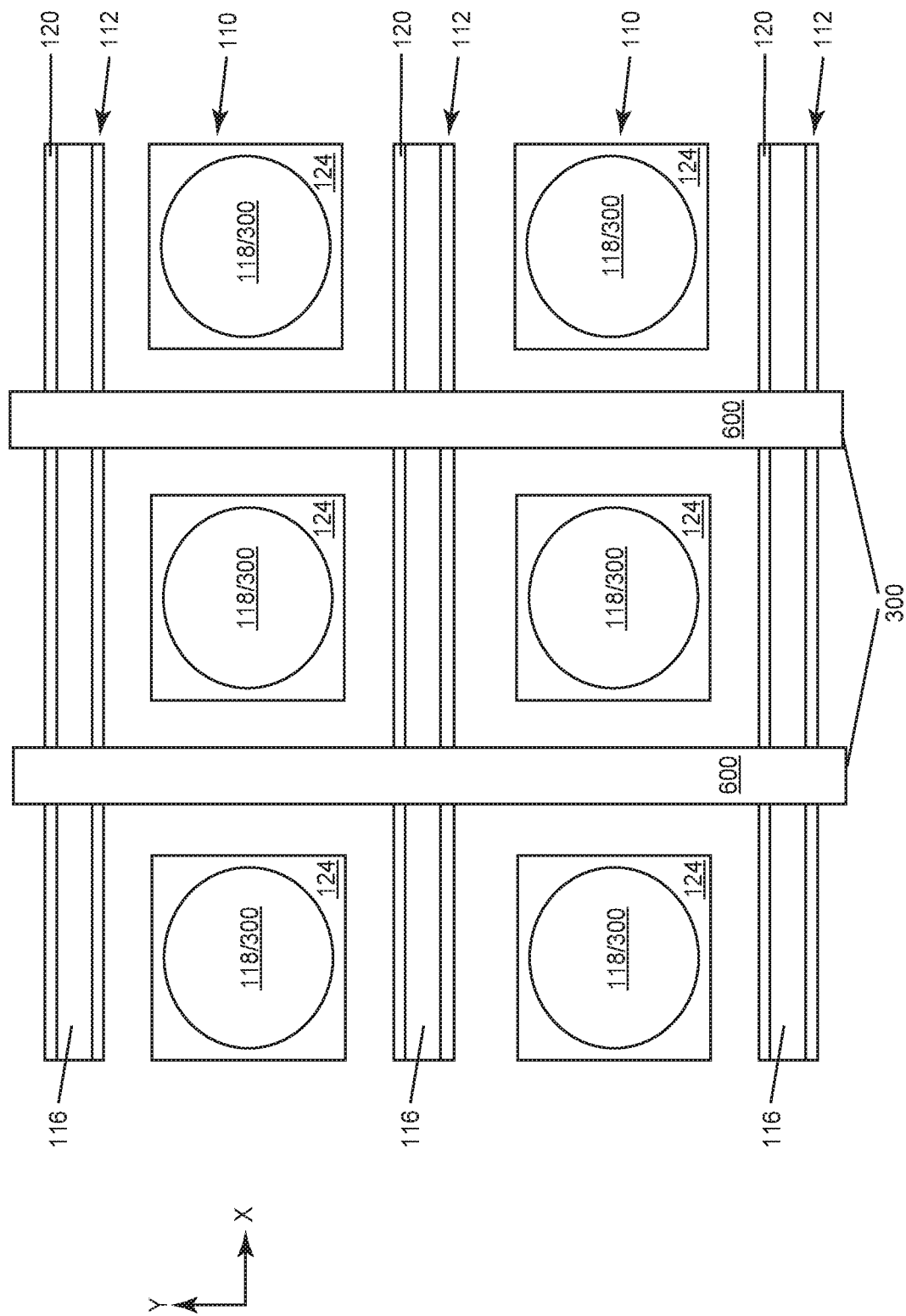

In FIG. 6, the current spread region 130 is formed as stripes 600 which extend lengthwise (direction 'y' in FIG. 6) between adjacent ones of the spicular-shaped field plate structures 110 and intersect neighboring ones of the stripe-shaped gate structures 112. In one embodiment, the stripe-shaped gate structures 112 run orthogonal (direction 'x' in FIG. 6) to the lengthwise extension direction of the stripes 600 of the current spread region 130.

The current spread region 130 may be formed by, after forming the source region 106, forming an additional lithography mask on the semiconductor substrate 100 and which has stripe-shaped openings extending lengthwise (direction 'y' in FIG. 6) between adjacent ones of the spicular-shaped field plate structures 110 and intersect neighboring ones of the stripe-shaped gate structures 112, and implanting a dopant species of the first conductivity type through the body region 104 using the additional lithography mask with the stripe-shaped openings. While an additional lithography step is needed according to this embodiment, the current spread region 200/600 is formed only in targeted regions, minimizing impact on breakdown voltage, DI BL (drain-induced barrier lowering) and avalanche.

Figure 7:
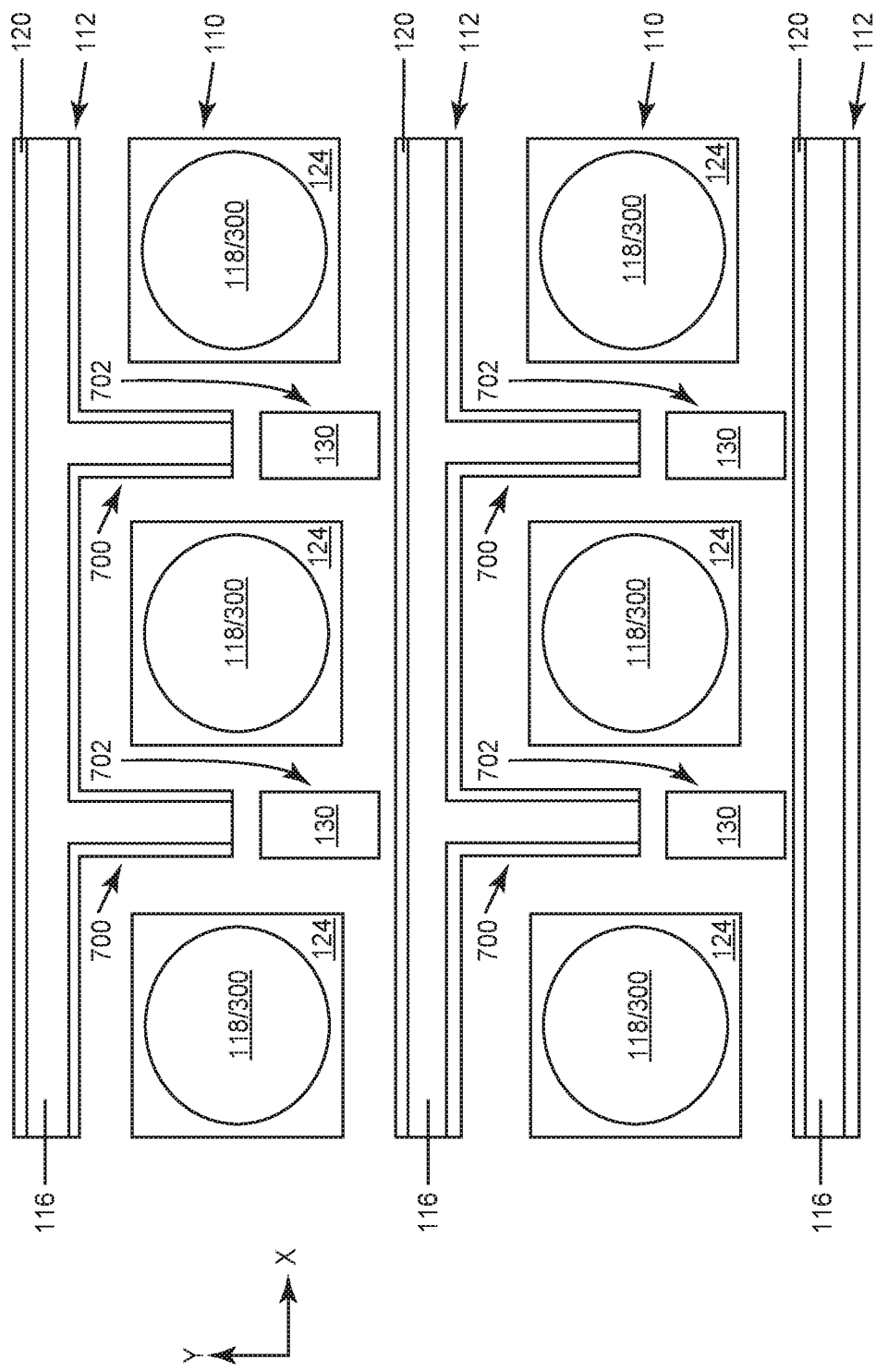

In FIG. 7, the stripe-shaped gate structures 112 have lateral extensions 700 which extend partly between adjacent ones of the spicular-shaped field plate structures 110 so that a gap 702 is present between each lateral extension 700 and a neighboring one of the stripe-shaped gate structures 110. For example, the stripe-shaped gate structures 112 may extend partly along an orthogonal direction (direction 'y' in FIG. 7) but not from one stripe-shaped gate trench structure 112 to the adjacent (neighboring) stripe-shaped gate trench structure 112 which run lengthwise in direction 'x' in FIG. 7. The current spread region 130 is confined to the gaps 702 in the lateral extensions 700 of the stripe-shaped gate structures 112.

The current spread region 130 may be formed by, after forming the source region 106, forming an additional lithography mask on the semiconductor substrate 100 and which has openings over the gaps 702 between the lateral extensions 700 of the stripe-shaped gate structures 112. A dopant species of the first conductivity type is then implanted through the body region 104 using the additional lithography mask having the openings over the gaps 702. Like the embodiment illustrated in FIG. 6, the embodiment illustrated in FIG. 7 requires an additional lithography step and forms the current spread region 130 only in targeted regions to minimize impact on breakdown voltage, DIBL and avalanche. The embodiment illustrated in FIG. 7 provides the additional flexibility for the FOMg/FOMgd/Ron trade-off previously described herein in connection with Tables 1 and 2.

Figure 8:
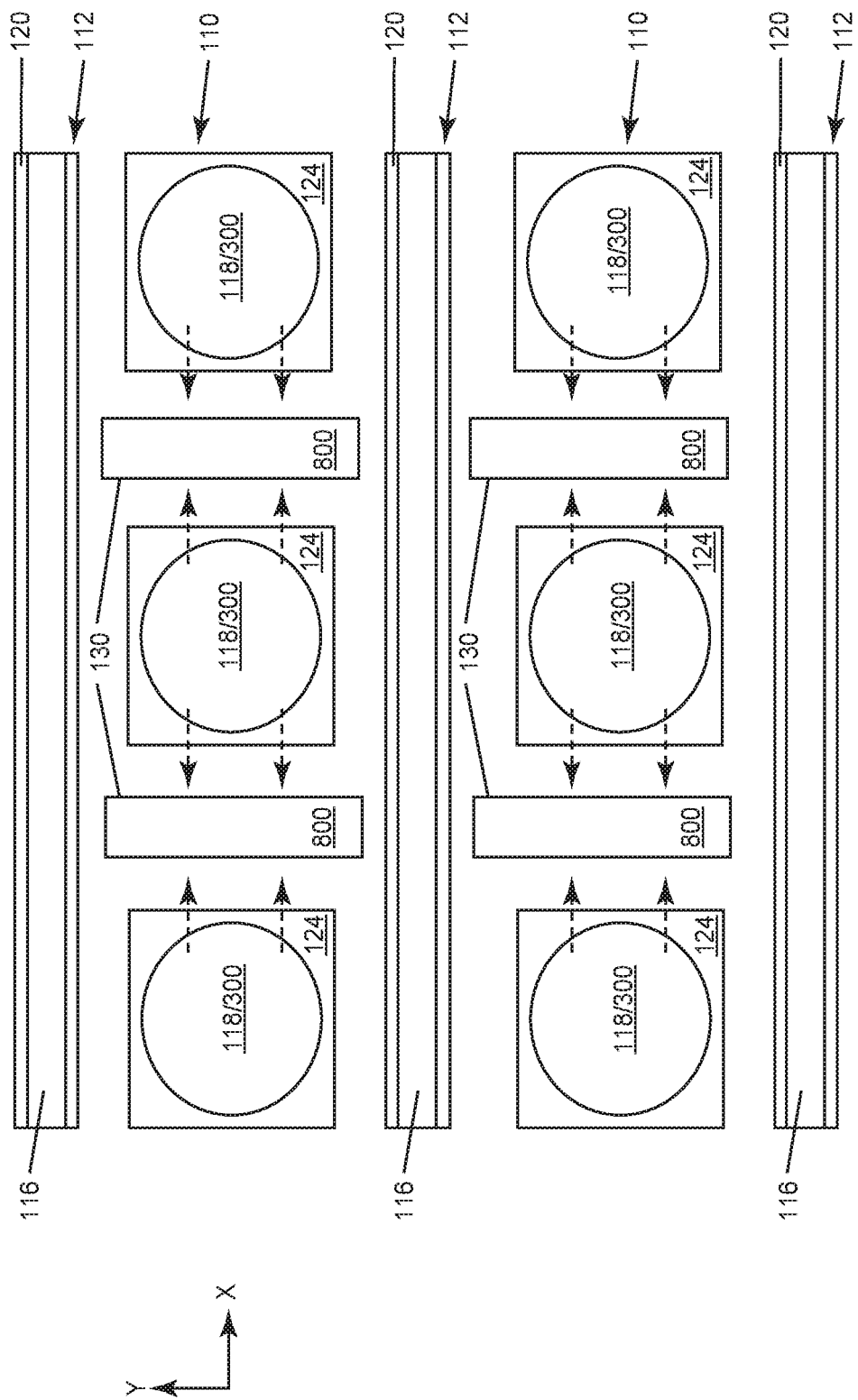

In FIG. 8, the current spread region 130 is formed as stripes 800 which extend lengthwise (direction 'y' in FIG. 8) between adjacent ones of the spicular-shaped field plate structures 110 and terminate before reaching neighboring ones of the stripe-shaped gate structures 112. In one embodiment, the stripe-shaped gate structures 112 run orthogonal (direction 'x' in FIG. 8) to the lengthwise extension direction of the stripes 800 of the current spread region 130.

The current spread region 130 may be formed by forming stripe-shaped grooves in the semiconductor substrate 100 which extend lengthwise (direction 'y' in FIG. 8) between adjacent ones of the spicular-shaped field plate structures 110 and terminate before reaching neighboring ones of the stripe-shaped gate structures 112, and implanting a dopant species of the first conductivity type into the stripe-shaped grooves. Like the embodiments illustrated in FIGS. 6 and 7, the embodiment illustrated in FIG. 8 also forms the current spread region 130 in targeted regions to minimize impact on breakdown voltage, DIBL and avalanche. However, by forming the stripe-shaped grooves in the semiconductor substrate 100 which run transverse to the stripe-shaped gate structures 112, a lower ion implantation energy may be used to form the stripes 800 of the current spread region 130 since the implantation is not done through the body region 104 or only through a partial thickness of the body region 104, thereby narrowing the distribution of the implanted ion depth.

The current spread ion implantation is not done over the stripe-shaped gate structures 112. Instead, open contact grooves are used to do a tilted implant from the sidewall 132 of the spicular-shaped field plate trenches 110 without requiring an extra lithography step. The contact grooves can be opened over the entire length of the field plate trenches 122. The current spread ion implantation can be performed using a twin-mode tilted implant on both sides of the spicular-shaped field plate trenches 110, as indicated by the dashed lines in FIG. 8.

Figure 9:
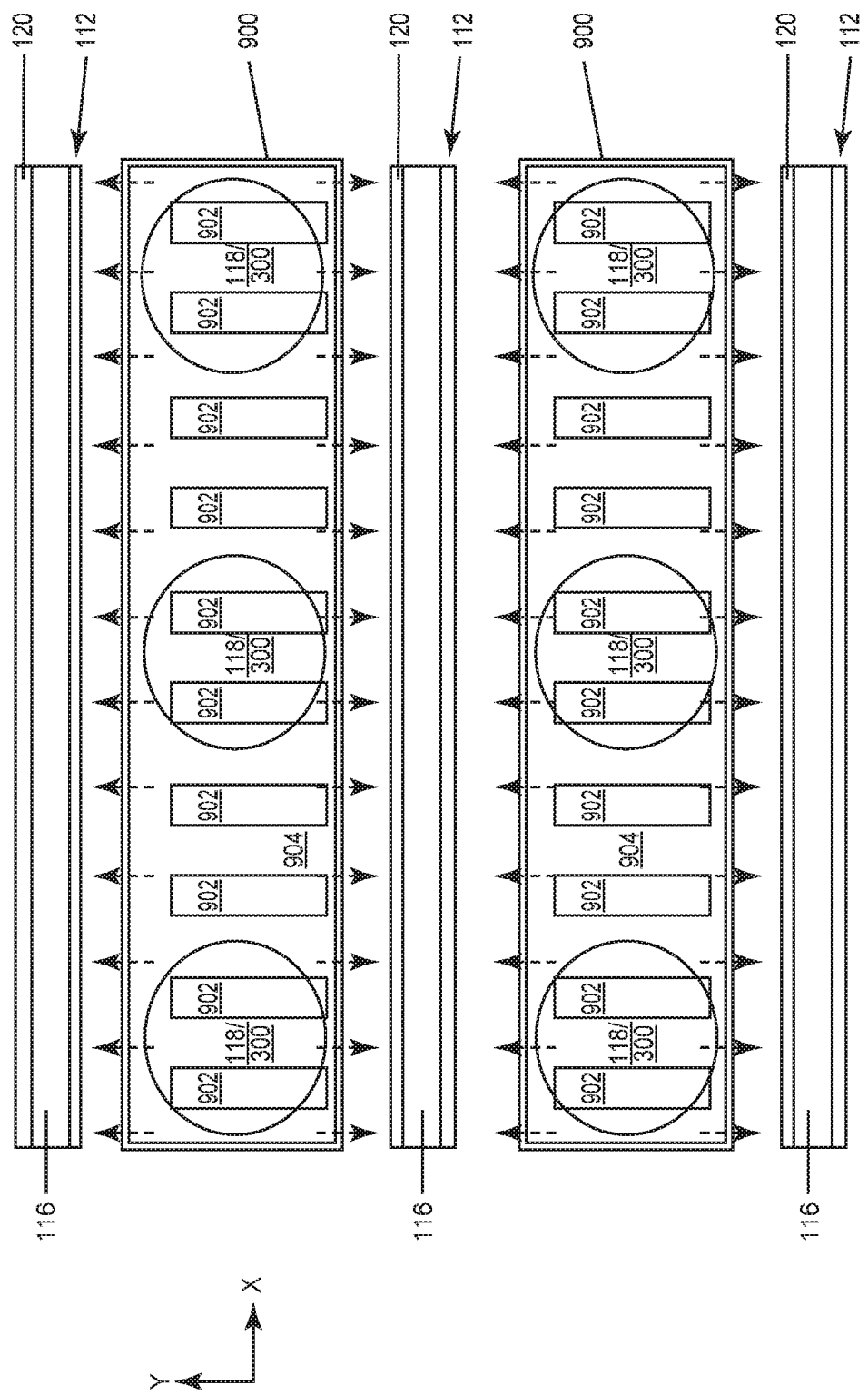

In FIG. 9, the current spread region 130 is defined by contact grooves 900 which run parallel (direction 'x' in FIG. 9) with the stripe-shaped gate structures 112 and are aligned with the rows of spicular-shaped field plate structures 110. The current spread region 130 may be formed by etching the contact grooves 900 into the semiconductor substrate 100, each contact groove having unetched stripe-shaped regions 902 (direction 'y' in FIG. 9) in parallel with one another, and implanting a dopant species of the first conductivity type into the contact grooves 900.

A relatively low energy ion implantation may be used to form the current spread region 130 since the implant is done through contact grooves 900. No extra lithography step is needed, and only a subsequent thermal budget for activating a highly-doped body contact region acts on the current spread implant, allowing for precise definition of the implanted ion depth. The contact grooves 900 have a stripe-like shape with bars 902 for easier fill with a metal, metal alloy, etc. to form a source/body contact 904, with 0° or tilted implant into the contact grooves 900 to form the current spread region 130. The current spread region 130 is not shown in FIG. 9, but the implantation process for the current spread region 130 is indicated by dashed lines in FIG. 9. By keeping unetched stripe-shaped regions 902 in each contact groove 900, there is no edge of contact which is better for lithographic processing in that identical open areas over the entire chip (die) provides for better control. The current spread ion implantation can be performed using a twin-mode tilted implant on both sides of the contact grooves 900.

In general, the rows of spicular-shaped field plate structures 110 may be shifted with respect to one another so that the power transistor cell may have, for example, a hexagonal grid-like layout when viewed from above and some gate connections may be omitted so that in the top layout view, the stripe-shaped gate structures 112 run in zig-zag patterns over the chip. Hence, the stripe-shaped gate structures 112 may run lengthwise in straight or zig-zag patterns.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor substrate comprising a drift region of a first conductivity type, a body region of a second conductivity type formed above the drift region, and a source region of the first conductivity type separated from the drift region by the body region;
    rows of spicular-shaped field plate structures formed in the semiconductor substrate, the spicular-shaped field plate structures extending through the source region and the body region into the drift region;
    stripe-shaped gate structures formed in the semiconductor substrate and separating adjacent rows of the spicular-shaped field plate structures; and
    a current spread region of the first conductivity type formed below the body region in semiconductor mesas between adjacent ones of the spicular-shaped field plate structures and which are devoid of the stripe-shaped gate structures, the current spread region configured to increase channel current distribution in the semiconductor mesas.

2. The semiconductor device of claim 1, wherein the current spread region abuts a sidewall of the spicular-shaped field plate structures.

3. The semiconductor device of claim 1, wherein the current spread region is confined by adjacent ones of the stripe-shaped gate structures.

4. The semiconductor device of claim 1, wherein the current spread region laterally extends from a sidewall of each of the spicular-shaped field plate structures to a sidewall of the adjacent stripe-shaped gate structure.

5. The semiconductor device of claim 1, wherein the current spread region comprises stripes which extend lengthwise between adjacent ones of the spicular-shaped field plate structures and intersect neighboring ones of the stripe-shaped gate structures.

6. The semiconductor device of claim 1, wherein the stripe-shaped gate structures have lateral extensions which extend partly between adjacent ones of the spicular-shaped field plate structures so that a gap is present between each lateral extension and a neighboring one of the stripe-shaped gate structures, and wherein the current spread region is confined to the gaps between the lateral extensions of the stripe-shaped gate structures and the neighboring stripe-shaped gate structures.

7. The semiconductor device of claim 1, wherein the current spread region comprises stripes which extend lengthwise between adjacent ones of the spicular-shaped field plate structures and terminate before reaching neighboring ones of the stripe-shaped gate structures.

8. The semiconductor device of claim 1, wherein the current spread region is defined by contact grooves which run parallel with the stripe-shaped gate structures and are aligned with the rows of spicular-shaped field plate structures.

9. The semiconductor device of claim 1, wherein the spicular-shaped field plate structures each comprise a field electrode disposed in a trench and a field dielectric insulating the field electrode from the semiconductor substrate.

10. The semiconductor device of claim 9, wherein the spicular-shaped field plate structures each comprise a connection region connected to and which is narrower than the field electrode, the field electrode being located deeper in the trench than the connection region, and wherein the current spread region is formed adjacent the connection region of the spicular-shaped field plate structures.

11. The semiconductor device of claim 1, wherein the current spread region has a peak doping concentration at a depth in the semiconductor substrate which is shallower than a bottom of the stripe-shaped gate structures.

12. The semiconductor device of claim 1, wherein each of the stripe-shaped gate structures comprises a gate electrode disposed in a trench and a gate dielectric insulating the gate electrode from the semiconductor substrate, wherein the current spread region has a lateral extension under the gate trenches, and wherein the gate oxide is thicker at a bottom of the gate trenches.

* * * * *